United States Patent [19]

Yasuda et al.

[11] Patent Number: 4,583,077
[45] Date of Patent: Apr. 15, 1986

[54] DEFLECTION SYSTEM IN AN ELECTRON BEAM EXPOSURE DEVICE

[75] Inventors: Hiroshi Yasuda; Haruo Tsuchikawa, both of Yokohama, Japan

[73] Assignee: Fujitsu Limited, Kawasaki, Japan

[21] Appl. No.: 536,467

[22] Filed: Sep. 27, 1983

[30] Foreign Application Priority Data

Sep. 27, 1982 [JP] Japan ............................... 57-166708

[51] Int. Cl.⁴ .......................................... H03K 13/02
[52] U.S. Cl. ......................... 340/347 DA; 340/347 M
[58] Field of Search ................ 340/347 DA, 347 AD, 340/347 M

[56] References Cited

U.S. PATENT DOCUMENTS 4,412,208 10/1983 Akazawa ..................... 340/347 DA
4,430,642  2/1984 Weigand et al. ............ 340/347 DA
4,503,421  3/1985 Hareyama et al. .......... 340/347 DA Primary Examiner—B. Dobeck
Attorney, Agent, or Firm—Armstrong, Nikaido, Marmelstein & Kubovcik

[57] ABSTRACT

In a D/A converter in a deflection system of an electron beam exposure device, the most significant bits (m bits) of input digital data consisting of n bits are input into a decoder circuit, and $2^m$ D/A converters which correspond to the m bits are provided. The data consisting of the least significant bits (n−m bits) is input into the $2^m$ D/A converters via $2^m$ gates, respectively. The decoder circuit is constructed so as to control the $2^m$ gates so that when the content of the data of the m bits is S, the first to S-th data of the $2^m$ D/A converters is all rendered to be "1", the data of the (S+1)-th D/A converter remains the same as the data of the n−m bits, and the data of the (S+2)-th and subsequent D/A converters is all rendered to be "0", the sum of the outputs of the $2^m$ D/A converters being applied to a coil which deflects the electron beam.

4 Claims, 7 Drawing Figures

|  | $A_0$ | $A_1$ | $A_2$ | $A_3$ | | $A_{15}$ | |
|---|---|---|---|---|---|---|---|
|  | $B_0$ | $B_1$ | $B_2$ | $B_3$ | ——— | $B_{14}$ | $B_{15}$ |
| 0 --- 0000 | 1 | 0 | 0 | 0 | 0 | 0 | 0 |
| 1 --- 0001 | 1 | 1 | 0 | 0 | 0 | 0 | 0 |
| 2 --- 0010 | 1 | 1 | 1 | 0 | 0 | 0 | 0 |
| 3 --- 0011 | 1 | 1 | 1 | 1 | 0 | 0 | 0 |
| 4 --- 0100 | 1 | 1 | 1 | 1 | 1 | 0 | 0 | 0 |
| ⋮ | | | | | | | |
| 16 --- 1111 | 1 | 1 | 1 | 1 | 1 | 1 | 1 | 0 |

DEFLECTION SYSTEM IN AN ELECTRON BEAM EXPOSURE DEVICE

BACKGROUND OF THE INVENTION

1. Field of the Invention

The present invention relates to a deflection system and more particularly to digital-to-analog (D/A) converters in the deflection system of an electron beam exposure device.

2. Description of the Prior Art

Digital-to-analog converters used in the deflection system of an electron beam exposure device must be capable of converting data consisting of 18 to 20 bits. However, conventional D/A converters are simply contructed only to a degree which renders them capable of converting data consisting of 12 to 14 bits. In conventional D/A converters, therefore, data consisting of the most significant bits, i.e., m bits, is decoded so as to turn on S constant-current (voltage) sources among $2^m$ constant-current (voltage) sources, and data consisting of the least significant bits, i.e., n−m bits, is input into the D/A converters so as to add the outputs in an analog manner.

In the above-mentioned system, however, the mismatching of the weighting of bits occurs when the data changes, for example, from 01111 to 10000, and deflection of the electron beam must be interrupted when the mismatching phenomenon occurs. In the above-mentioned system, furthermore, the mismatching of bits occurs due to the mismatching of the weighting of the resistances of switching transistors which work to convert binary signals into analog signal, and the pattern which is described becomes locally narrowed or widened. Further, a Gritch phenomenon occurs due to the simultaneous switching of data having different weighting values.

Namely, in the above-mentioned conventional system, it is difficult to maintain a monotone increase, which is the most important requirement for an electron beam exposure device. To maintain a monotone increase, it is necessary to finely adjust the output of the constant-current (voltage) source.

OBJECTS AND SUMMARY OF THE INVENTION

An object of the present invention is to provide in the deflection system of an electron beam exposure device a D/A converter which is capable of maintaining monotone increase through simple adjustment.

Another object of the present invention is to provide a D/A converter which can prevent the mismatching of the weighting of bits.

A further object of the present invention is to provide a D/A converter which can prevent the Gritch phenomenon.

The above-mentioned objects can be achieved by providing a deflection system in an electron beam exposure device characterized in that the most significant bits (m bits) of input digital data consisting of n bits are input into a decoder circuit, $2^m$ D/A converters which correspond to the m bits are provided, and data consisting of the least significant bits (n−m bits) is input into the $2^m$ D/A converters via $2^m$ gate circuits, respectively, the input/output data all being rendered to be "1" beginning with the first D/A converter, the output of the $2^m$ D/A converters being analogically added, and the added data being applied to a coil which deflects the electron beam.

Further features and advantages of the present invention will be apparent from the ensuing description, made with reference to the accompanying drawings, to which, however, the scope of the invention is in no way limited.

DESCRIPTION OF THE PREFERRED EMBODIMENTS

Figure 1:
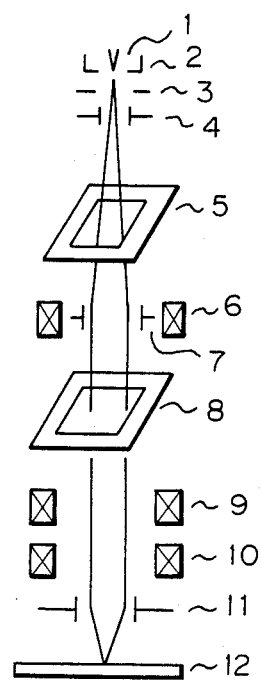
FIG. 1 is a schematic view of a conventional electron beam exposure device.

FIG. 1 is a schematic view of an example of a conventional electron beam exposure device. Referring to FIG. 1, reference numerals 1, 2, and 3 designate a cathode, a grid, and an anode, respectively, constituting an electron gun. Reference numeral 4 designates a deflection unit for blanking an electron beam, 5 a first diaphragm having a first aperture of a polygon, 6 an electron lens, 7 a deflection unit for controlling the position of the images formed by the electron lens 6 on a second diaphragm 8 having a second aperture of a polygon for deflecting the beam passed through the first diaphragm 5, 9 a de-magnifying lens, 10 a focusing lens, and 11 a deflection unit for positioning a shaped beam formed on a sample of, for example, a semiconductor wafer on which a resist is coated.

As was explained in the description of the prior art, the D/A converters used in the deflection systems 7 and 11 of the electron beam exposure device shown in FIG. 1 must be capable of converting data consisting of 18 to 20 bits. Usually, however, the D/A converters are simply constructed to a degree capable of converting data consisting of 12 to 14 bits. In the conventional D/A converters, therefore, data consisting of m bits is decoded to turn on S constantcurrent (voltage) sources among $2^m$ constant-current (voltage) sources, and data consisting of n−m bits is input into the D/A converter to add the outputs in an analog manner.

Figure 2:
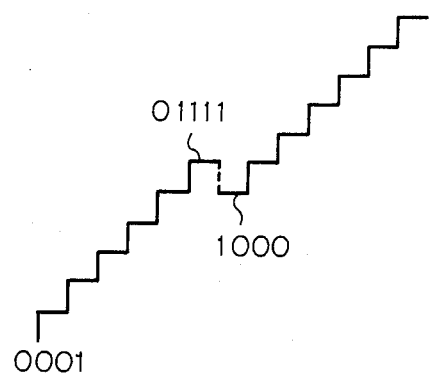
FIG. 2 is a diagram illustrating the mismatching of the weighting of bits, which is a defect inherent in the conventional electron beam exposure device.

In the above-mentioned system, however, the mismatching of the weighting of bits occurs when the data changes, for example, from 01111 to 10000, as is shown in FIG. 2, and deflection of the electron beam must be interrupted when the mismatching phenomenon occurs. In the above-mentioned system, furthermore, the mismatching of bits occurs due to the mismatching of the weighting resistances of the switching transistors which work to convert binary signals into analog signals, and the pattern which is described becomes locally narrowed or widened.

The gist of the present invention resides in the fact that a D/A converter for deflection of an electron beam comprises a plurality of small converters, and the input- /output data is all successively rendered to be "1", beginning with the first D/A converter, so as to prevent the Gritch phenomenon. This circuit connection is illustrated in FIG. 3.

Figure 3:
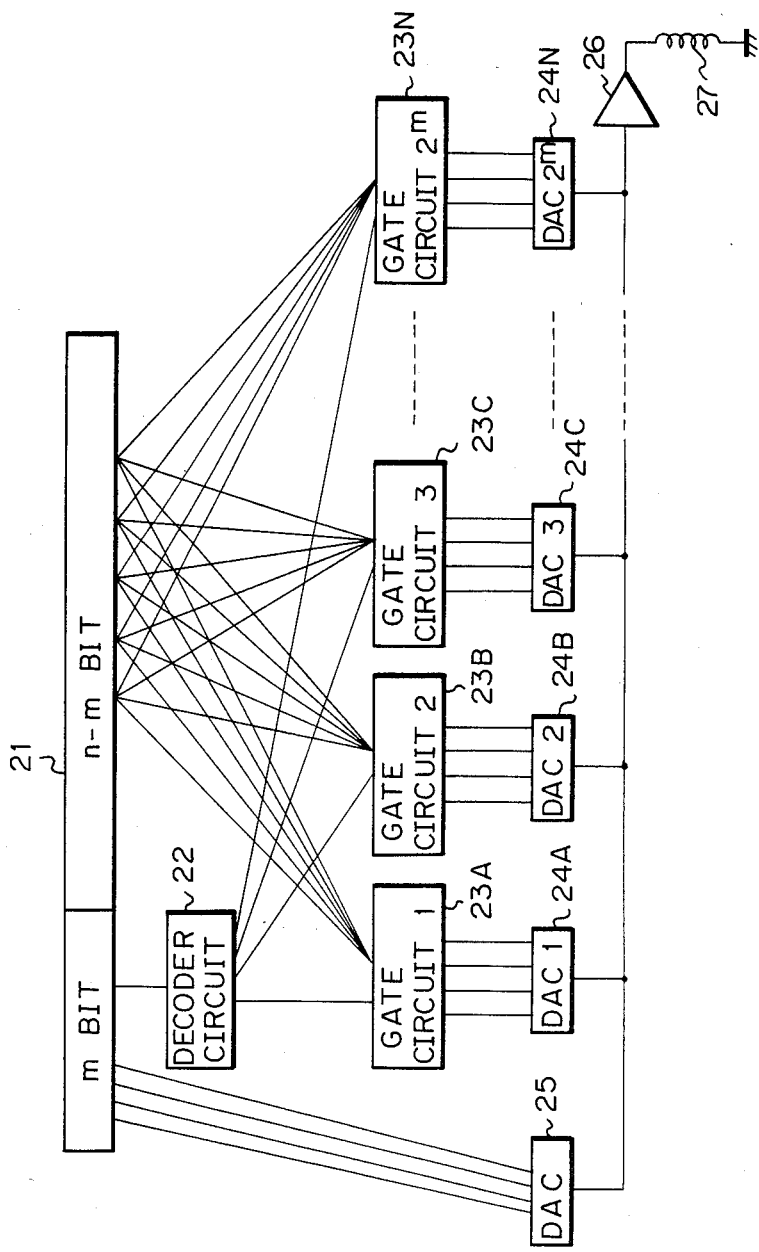
FIG. 3 is a circuit diagram D/A converters employed in the device of the present invention.

In FIG. 3, the input data 21 is divided into m bits and n−m bits. The m bits are applied to a decoder circuit 22 which sends an output to a gate circuit 1 (23A), a gate circuit 2 (23B), ---, and a gate circuit $2^m$ (23N). The n-m bits are applied to a D/A converter 1 (24A), a D/A converter 2 (24B), ---, a D/A converter $2^m$ (24N) via the gate circuit 1 (23A), the gate circuit 2 (23B), ---, and the gate circuit $2^m$ (23N), respectively. The number $2^m$ of D/A converters (24A to 24N) corresponds to the number of m bits. Furthermore, the m bits are applied to a D/A converter 25, outputs of the D/A converters 24A, 24B, ---, 24N, and 25 are added by an amplifier 26, and the sum is applied to a deflection coil 27.

Figure 4:
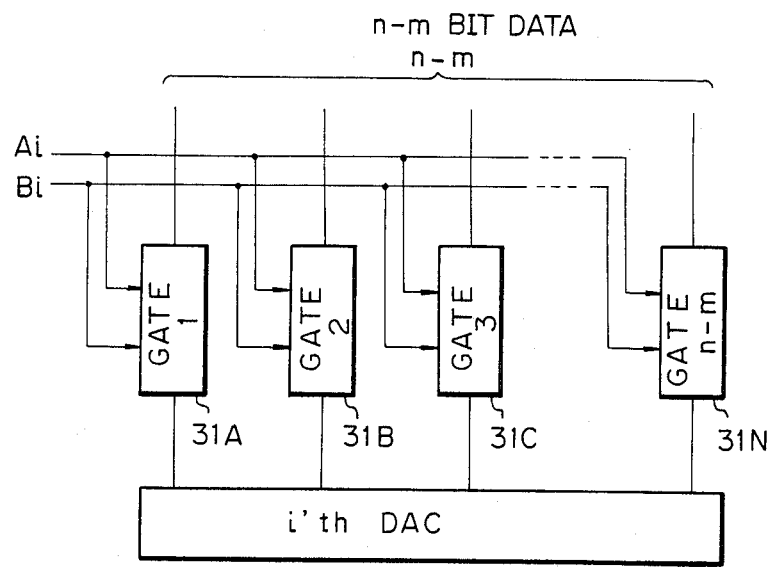
FIG. 4 is a circuit diagram illustrating in detail the gate circuits of FIG. 3.

In the present invention, if the m bits are supposed to be 4 bits, the decoder cirucit consists of a binary-hexadecimal converter which converts a binary code consisting of 4 bits into a hexadecimal number. The thus-converted output is applied to the gate circuits 23A, 23B, ---, and 23N. FIG. 4 illustrates the gate circuits 23A, 23B, ---, and 23N in detail, in which the gates 31A, 31B, ---, and 31N receive outputs Ai and Bi from the decoder circuit 22 and data consisting of n−m bits. As is shown in detail in FIG. 5, each of the gates 31A, 31B, ---, and 31N consists of AND circuits AND 1, AND 2, and AND 3 and an OR circuit OR.

Figure 5:
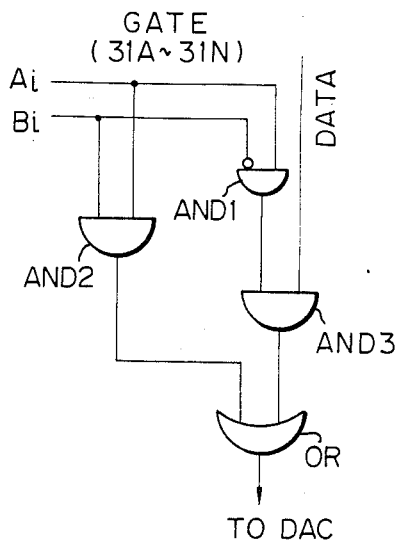
FIG. 5 is a circuit diagram illustrating in detail the gates of FIG. 4.

The circuit of FIG. 5 operates as follows:
(a) When Ai=1 and Bi=1, the AND circuit AND 2 produces an output "1". Therefore, the circuit of FIG. 5 sends an output "1" to the D/A converter irrespective of the presence or absence of data.
(b) When Ai=1 and Bi=0, the AND circuit AND 1 produces an output "1", and the AND circuit AND 2 produces an ouptut "0". Therefore, the data becomes effective and is applied to the D/A converter through the OR circuit OR.
(c) When Ai=0 and Bi=0, the AND circuits AND 1 and AND 2 produce an output "0". The ouptut "0" is applied to the D/A converter through the OR circuit OR irrespective of the presence or absence of data.

Figures 6, 7:
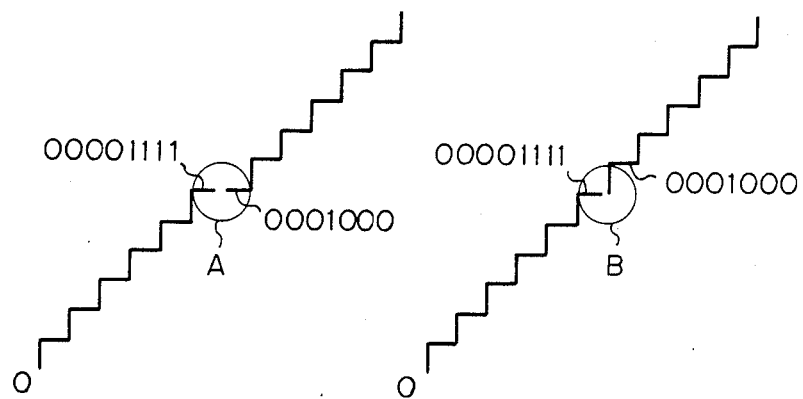
FIG. 6 is a diagram illustrating the operation of the circuit of FIG. 3.
FIG. 7 is a diagram illustrating the operation of the D/A converter 25 of FIG. 3.

It will, therefore, be obvious that the D/A converters 24A to 24N in the circuit of FIG. 3 produce outputs, as is illustrated in FIG. 6, which represent the case where m is 4, i.e., the m bits are 4 bits, and there are 16 D/A converters. In FIG. 6, the symbols $A_0$, $B_0$, $A_1$, --- at the top of the figure represent outputs of the decoder circuit 22, the numerals 0:0000, 1:0001, --- at the left of the figure represent inputs of the decoder circuit 22, and the numerals at the right of the figure represent outputs of the D/A converters 24A, 24B, ---, 24N that correspond to the inputs 0:0000, 1:0001, --- of the decoder circuit 22.

In FIG. 3, the D/A converter 25 has the following function. Namely, in the D/A converter $2^m$, a step 00001111 usually has the same level as a step 00010000, and, hence, one step is lost. The D/A converter 25 functions as an adjusting circuit which provides a difference of one step between the level 00001111 and the level 00010000.

According to the present invention, as was described in detail in the foregoing, there is provided an electron beam exposure device which requires only simple adjustment and which assures a monotone increase.

We claim:

1. A deflection system in an electron beam exposure device comprising a decoder circuit means for receiving the most significant bits (m bits) of an n bit digital data signal; $2^m$ D/A converters corresponding to the m bits; $2^m$ gate circuit means coupled to the inputs of said $2^m$ D/A converters, for applying the least significant bits (n−m bits) of the digital data signal to said $2^m$ D/A converters, wherein the outputs of said $2^m$ D/A converters are "1" beginning with the first of said $2^m$ D/A converters; means for analog adding the outputs of said $2^m$ D/A converters; and a further D/A converter, coupled to said means for adding, wherein the output of said further D/A converter is analog added to the outputs of said $2^m$ D/A converters to create a difference of one step between the level 00001111 and the level 00010000, and wherein the output of said means for adding is applied to deflection means for deflecting the electron beam.

2. A deflection system in an electron beam exposure device according to claim 1, wherein said decoder circuit means controls said $2^m$ gate circuit means when the content of the data of the m bits is S, such that the first to S-th outputs of said $2^m$ D/A converts are all "1", the outputs of the (S+1)-th D/A converter remains the same as the n−m bits, and the outputs of the (S+2)-th and subsequent D/A converters are "0".

3. A deflection system in an electron beam exposure device according to claim 2, wherein each gate circuit means of said $2^m$ gate circuit means comprises n−m gates controlled by said decoder circuit means, said n−m gates receiving the n−m bit data of said input digital data wherein the output of each of said $2^m$ gate circuit means is applied to a corresponding one of said $2^m$ D/A converters.

4. A deflection system in an electron beam exposure device according to claim 3, wherein each gate of said n−m gates comprises a first AND circuit for receiving a first input and a second, inverted input from said decoder circuit means, a second AND circuit for receiving the first input and second input from said decoder circuit means, a third AND circuit for receiving one of the n−m bits and the output of said first AND circuit, and an OR circuit for receiving the outputs of said first AND circuit and said second AND circuit and for supplying an output to a corresponding one of said $2^m$ D/A converters.

* * * * *